(12) United States Patent
Kim et al.

(10) Patent No.: US 11,444,043 B2
(45) Date of Patent: Sep. 13, 2022

(54) SUBSTRATE HAVING EMBEDDED ELECTRONIC COMPONENT

(71) Applicant: SAMSUNG ELECTRO-MECHANICS CO., LTD., Suwon-si (KR)

(72) Inventors: Hong In Kim, Suwon-si (KR); Thomas A Kim, Suwon-si (KR); Tae Sung Jeong, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/408,814

(22) Filed: May 10, 2019

(65) Prior Publication Data

US 2019/0267338 A1    Aug. 29, 2019

Related U.S. Application Data

(63) Continuation of application No. 15/789,021, filed on Oct. 20, 2017, now Pat. No. 10,340,234.

(30) Foreign Application Priority Data

Mar. 28, 2017    (KR) .......................... 10-2017-0039386

(51) Int. Cl.
*H01L 23/66*    (2006.01)
*H01L 23/13*    (2006.01)
(Continued)

(52) U.S. Cl.
CPC .............. *H01L 23/66* (2013.01); *H01L 23/13* (2013.01); *H01L 23/5384* (2013.01); *H01L 23/5386* (2013.01); *H01L 23/5389* (2013.01);
*H01Q 1/2283* (2013.01); *H01Q 9/27* (2013.01); *H01L 21/486* (2013.01); *H01L 21/565* (2013.01);
(Continued)

(58) Field of Classification Search
CPC ..... H01L 21/486; H01L 21/565; H01L 23/66; H01L 23/13; H01L 23/3121; H01L 23/5384; H01L 23/5386; H01L 23/5389; H01L 23/3677; H01L 2223/6683; H01L 2223/6677; H01L 24/20; H01L 2224/18; H01Q 9/27; H01Q 1/38; H01Q 1/2283;
(Continued)

(56) References Cited

U.S. PATENT DOCUMENTS

2003/0133274 A1* 7/2003 Chen ................... H01L 23/5389
361/760
2005/0088833 A1* 4/2005 Kikuchi ............ H01L 23/49822
361/763
(Continued)

FOREIGN PATENT DOCUMENTS

JP    2014-170811 A    9/2014
JP    2015-133485 A    7/2015
(Continued)

*Primary Examiner* — Robert G Bachner
(74) *Attorney, Agent, or Firm* — NSIP Law

(57) ABSTRACT

Disclosed are substrates having an electronic component, including a frame having a through hole, the electronic component disposed in the through hole, a first wiring portion formed on a surface of the frame and the electronic component, a first layer formed on the first wiring portion, and a second wiring portion formed on the first layer, and the second wiring portion including an antenna layer.

20 Claims, 7 Drawing Sheets

(51) Int. Cl.
- *H01L 23/538* (2006.01)
- *H01Q 1/22* (2006.01)
- *H01Q 9/27* (2006.01)
- *H01L 21/56* (2006.01)
- *H01L 21/48* (2006.01)
- *H01L 23/31* (2006.01)
- *H01L 23/367* (2006.01)

(52) U.S. Cl.
CPC ...... *H01L 23/3121* (2013.01); *H01L 23/3677* (2013.01); *H01L 2223/6677* (2013.01); *H01L 2223/6683* (2013.01)

(58) Field of Classification Search
CPC ................. H05K 1/0298; H05K 1/183; H05K 2201/10098; H05K 2201/09227
See application file for complete search history.

(56) References Cited

U.S. PATENT DOCUMENTS

| | | | |
|---|---|---|---|
| 2009/0166811 | A1 | 7/2009 | Fujii |
| 2013/0009320 | A1* | 1/2013 | Yoo ..................... H01L 23/5226 257/774 |
| 2013/0249663 | A1* | 9/2013 | Cho ........................ H01F 38/14 336/200 |
| 2014/0210082 | A1* | 7/2014 | Kubota .................. H05K 1/144 257/738 |
| 2014/0246745 | A1 | 9/2014 | Kinugasa et al. |
| 2015/0084194 | A1* | 3/2015 | Molzer ................. H01L 23/481 257/741 |
| 2016/0336296 | A1* | 11/2016 | Jeong ............... H01L 23/49822 |
| 2017/0033062 | A1* | 2/2017 | Liu ....................... H01L 21/486 |
| 2017/0345731 | A1* | 11/2017 | Chiang ................... H01L 24/20 |

FOREIGN PATENT DOCUMENTS

| | | |
|---|---|---|
| KR | 10-2009-0071482 A | 7/2009 |
| KR | 10-2013-0077565 A | 7/2013 |

\* cited by examiner

SUBSTRATE HAVING EMBEDDED ELECTRONIC COMPONENT

CROSS-REFERENCE TO RELATED APPLICATION(S)

This application is a continuation of U.S. patent application Ser. No. 15/789,021 filed on Oct. 20, 2017 which claims the benefit under 35 USC § 119(a) of Korean Patent Application No. 10-2017-0039386 filed on Mar. 28, 2017 in the Korean Intellectual Property Office, the entire disclosure of which is incorporated herein by reference for all purposes.

BACKGROUND

1. Field

The following description relates to a substrate having an embedded electronic component.

2. Description of Related Art

Due to the mass adoption of mobile smart devices and services, mobile data traffic has doubled every year and is expected to increase by more than 1000 times in 10 years. Mobile network operators are increasingly burdened by the rapid increase in mobile traffic.

Conventional 4G mobile communications with limited additional frequency coverage may be unable to accommodate the expected increase of 1000 times the current capacity. Therefore, the development of 5G mobile communications technology, based on a millimeter wave capable of securing a wide bandwidth, has been undertaken worldwide.

One of the main propagation characteristics of millimeter waves is the generation of higher path loss, so that a relatively large number of antennas may be mounted in the same area due to the short wavelength. Therefore, signals may be transmitted while being concentrated in a specific direction, so it is desirable to develop a substrate having an electronic component mounted thereon with an antenna capable of receiving a signal concentrated in the corresponding direction.

Furthermore, it is desirable to develop a substrate having an electronic component mounted thereon with an antenna capable of reducing the occurrence of defects and securing a desired level of performance.

SUMMARY

This Summary is provided to introduce a selection of concepts in a simplified form that are further described below in the Detailed Description. This Summary is not intended to identify key features or essential features of the claimed subject matter, nor is this Summary intended to be used as an aid in determining the scope of the claimed subject matter.

In one general aspect, there is provided a substrate In one general aspect, there is provided a substrate having an electronic component, including a frame having a through hole, the electronic component disposed in the through hole, a first wiring portion formed on a surface of the frame and the electronic component, a first layer formed on the first wiring portion, and a second wiring portion formed on the first layer, and the second wiring portion including an antenna layer.

The antenna layer may include a plurality of layers.

The first layer may include a via connecting a pattern layer of the first wiring portion and the antenna layer of the second wiring portion.

The electronic component may include an RF IC chip disposed in a central portion of the through hole, and a passive device is disposed around the RF IC chip.

The through hole may be filled with a molding layer to fix the electronic component.

A connection electrode may be provided in the molding layer, and may be configured to form an external electrical connection.

An inner surface of the frame may be provided with a conductor layer.

A via may be formed in the frame to provide external electrical connection.

The first layer may be formed of a film of a photo imageable dielectric (PID) material.

The antenna layer may include a main antenna layer connected to the electronic component, and a dummy antenna layer disposed above the main antenna layer.

The substrate may include an insulating layer formed on another surface of the frame and the electronic component.

An electrode pad may extend externally out of the insulating layer.

The electrode pad may be connected to the electronic component through a via member.

The antenna layer may have any one or any combination of a spiral shape, a circular shape, an elliptical shape, a quadrangular spiral shape, a quadrangular shape, an elliptical spiral shape, a hexagonal shape, a hexagonal spiral shape, and a polygonal shape.

A thickness of the first layer may be greater than a thickness of the first wiring portion.

A size of at least one layer of the plurality of layers may be different from sizes of remaining layers of the plurality of layers.

In another general aspect, there is provided a substrate having an electronic component, including a frame having a through hole, the electronic component disposed in the through hole, a first wiring portion formed on a surface of the frame and the electronic component, a first layer formed on the first wiring portion, a second wiring portion formed on the first layer, and second wiring portion including an antenna layer, an insulating layer formed on another surface of the frame and the electronic component, and a via member connecting an electrode pad formed in the insulating layer to the electronic component.

The antenna layer may include a main antenna layer connected to the electronic component, and a dummy antenna layer disposed above the main antenna layer.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for the purposes of clarity, illustration, and convenience.

DETAILED DESCRIPTION

Figure 1:
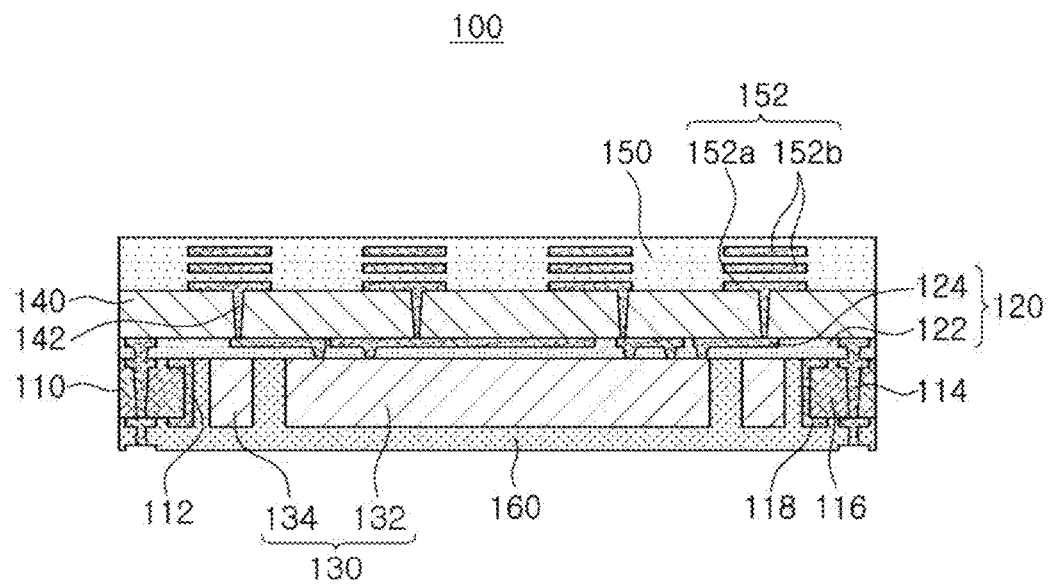
FIG. 1 is a diagram illustrating a substrate having an electronic component embedded therein according to a first example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after gaining a thorough an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

Throughout the specification, when an element, such as a layer, region, or substrate, is described as being "on," "connected to," "coupled to," "over," or "covering" another element, it may be directly "on," "connected to," "coupled to," "over," or "covering" the other element, or there may be one or more other elements intervening therebetween. In contrast, when an element is described as being "directly on," "directly connected to," "directly coupled to," "directly over," or "directly covering" another element, there can be no other elements intervening therebetween.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. As used herein, the term "and/or" includes any one and any combination of any two or more of the associated listed items.

Due to manufacturing techniques and/or tolerances, variations of the shapes shown in the drawings may occur. Thus, the examples described herein are not limited to the specific shapes shown in the drawings, but include changes in shape that occur during manufacturing.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Figure 2:
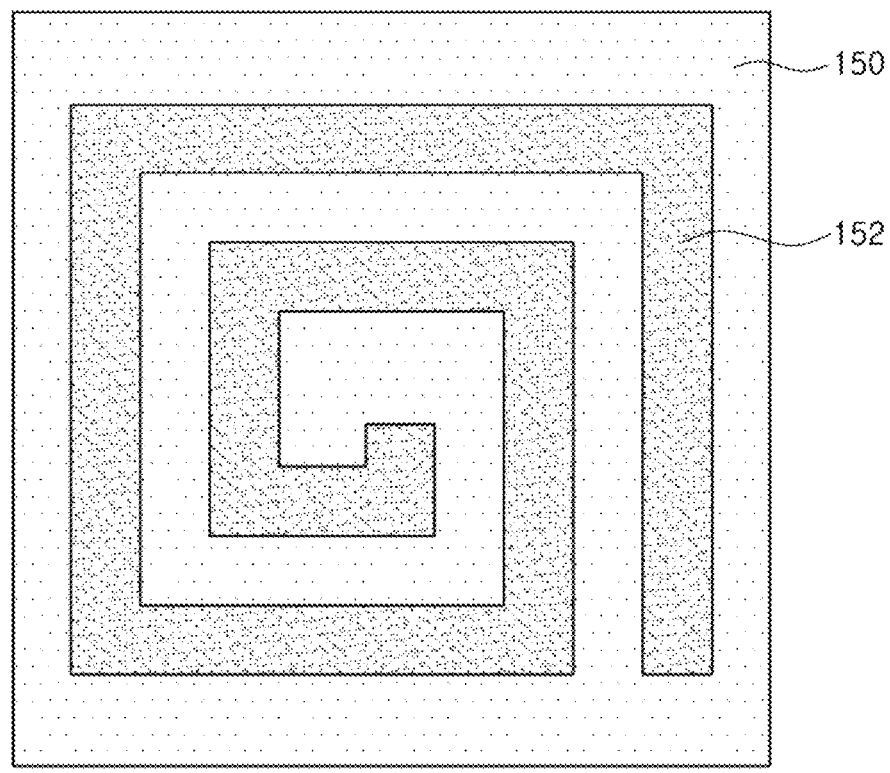
FIG. 2 is a diagram illustrating an example of a substrate having an electronic component embedded therein.

FIG. 1 is a diagram illustrating a substrate having an electronic component embedded therein according to a first example, and FIG. 2 is a diagram illustrating an example of a substrate having an electronic component embedded therein according to a first example.

Referring to FIGS. 1 and 2, a substrate 100 having an electronic component embedded therein according to a first example includes a frame 110, a first wiring portion 120, an electronic component 130, a first layer 140, and a second wiring portion 150.

In an example, a through hole 112 is formed in the frame 110, and an electronic component 130 may be inserted in the through hole 112. The frame 110 is disposed to surround the electronic component 130. In an example, the electronic component 130 has a plate shape and is disposed in the through hole 112.

In an example, a first via 114 is formed in the frame 110. In an example, the frame 110 includes a core 116 and a conductor layer 118 formed on an external surface of the core 116.

In an example, the core 116 is formed of an insulating material, such as, for example, a thermosetting resin such as an epoxy resin, a thermoplastic resin such as polyimide, or a resin impregnated with a reinforcing material such as a glass fiber or an inorganic filler, for example, prepreg, an ajinomoto build-up film (ABF), FR-4, a bismaleimide triazine (BT) resin. A metal with excellent rigidity and thermal conductivity may be disposed in the core 116. In an example, the metal is a metal such as, for example a Fe—Ni-based alloy, and a Cu plating layer may be formed on a surface of the Fe—Ni-based alloy. Other materials such as, for example glass, ceramic, or plastic may be disposed in the core 116 without departing from the spirit and scope of the illustrative examples described.

In an example, the conductor layer 118 is composed of a material, such as, for example, silver (Ag), palladium (Pd), aluminum (Al), nickel (Ni), titanium (Ti), gold (Au), copper (Cu), platinum (Pt) or a mixture of at least two materials. The material of the conductor layer 118 is a good conductor. In an example, the conductor layer 118 is formed using a method, such as, for example, electrolytic copper plating, and electroless copper plating. In an example, the conductor layer is formed using a method such as, for example, chemical vapor deposition (CVD), physical vapor deposition (PVD), sputtering, a subtractive, additive, or semi-additive process (SAP), a modified semi-additive process (MSAP). Other methods for forming the conductor layer are considered to be well within the scope of the present disclosure.

In an example, a molding layer 160 is formed in the through hole 112 and a bottom surface of the frame 110, and the electronic component 130 is fixed in the through hole 112 by the molding layer 160.

In an example, the first wiring portion 120 is formed on at least one surface of the frame 110 and the electronic component 130. By way of example, the first wiring portion 120 may include a first insulating layer 122 and a first wiring layer 124. In an example, an antenna layer 152 of the second wiring portion 150, which will be described later, is electrically connected to the first wiring layer 124 exposed from the first wiring portion 120.

In an example, the first wiring layer 124 of the first wiring portion 120 may be connected to the electronic component 130.

In an example, the electronic component 130 is installed in the first wiring portion 120 to be inserted into the through hole 112 of the frame 110. In an example, the electronic component 130 includes an RF IC chip 132 disposed in a central portion of the through hole 112, and a passive device 134 disposed around the RF IC chip 132.

In an example, the passive device 134 is provided as a plurality of passive devices installed around the RF IC chip 132.

In an example, the RF IC chip 132 is a 5G RF IC chip using millimeter-wave (mmWave), and the passive device 134 is a device transferring or absorbing electrical energy in an electrical circuit, in a manner similar to a resistor, a capacitor, an inductor, and a transformer, rather than having an active function such as amplification or conversion of electrical energy.

In an example, the first layer 140 may be formed on the other surface of the first wiring portion 120. In other words, the electronic component 130 is installed in one surface of the first wiring portion 120, and the first layer 140 may be formed on the other surface of the first wiring portion 120.

In an example, the first layer 140 is formed of a photo imageable dielectric (PID) film. In an example, a second via 142 is formed in the first layer 140. The second via 142 connects the first wiring layer 124 of the first wiring portion 120 to the antenna layer 152 of the second wiring portion 150.

In an example, the first layer 140 may have a thickness greater than that of the first wiring portion 120.

As described above, the first layer 140 is formed of a photo imageable dielectric (PID) film. Thus, formation of a via having a smaller diameter than is possible, and a misalignment of a connection line, i.e., the first wiring layer 124, the second via 142, and the antenna layer 152 is reduced.

In an example, the second wiring portion 150 is formed on the first layer 140, and may include the antenna layer 152. The antenna layer 152 may be provided as a plurality of antenna layers formed in the second wiring portion 150. In an example, the second via 142 connects a pattern layer of the first wiring portion 120 and the antenna layer 152 of the second wiring portion 150.

Meanwhile, as described above, the antenna layer 152 is connected to the second via 142 of the first layer 140, which is connected to the RF IC chip 132 of the electronic component 130.

By way of example, the antenna layer 152 may include a main antenna layer 152a connected to the electronic component 130, and a dummy antenna layer 152b disposed above the main antenna layer 152a.

In an example, the antenna layer 152 has a quadrangular spiral shape. However, other arrangements of the antenna layer 152 are considered to be well within the scope of the present disclosure As described above, the antenna layer 152 is formed in the second wiring portion 150, so operations may be reduced. In addition, the antenna layer is formed of different types of materials, so the occurrence of warpage caused by a difference in coefficients of thermal expansion may be suppressed.

Furthermore, the first layer 140 is formed of a film of a photo imageable dielectric (PID) material, so a diameter of the second via 142 may be variously changed. Thus, misalignment of the first wiring layer 124, the second via 142, and the antenna layer 152 may be reduced, and unnecessary losses avoided.

In addition, as the antenna layer 152 may be formed to be stacked, a connection line is reduced, so the loss caused by the connection line may be reduced.

Furthermore, as a thickness of a first layer is adjusted, a bandwidth is adjusted, so thinning may be implemented.

Figure 3:
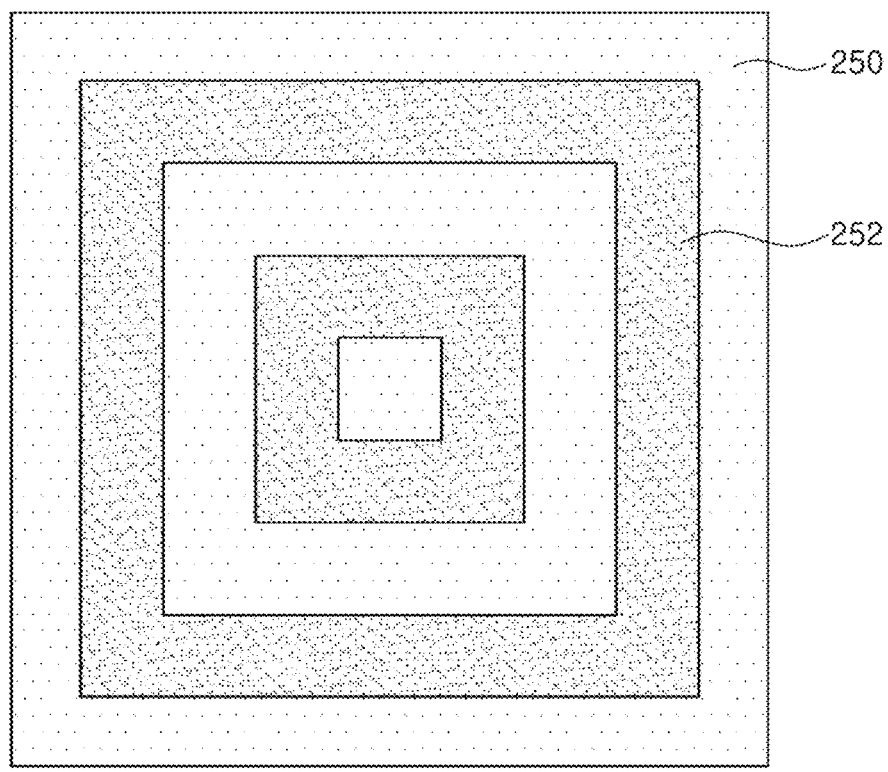
FIG. 3 is a diagram illustrating a first modified example of an antenna layer.

FIG. 3 is a diagram illustrating a first modified example of an antenna layer.

Referring to FIG. 3, a second wiring portion 250 includes an antenna layer 252. In an example, the antenna layer 252 is provided as a plurality of layers formed in the second wiring portion 250.

In an example, the antenna layer 252 has a quadrangular shape when viewed from above. In other words, the antenna layer 252 may be formed to have a plurality of quadrangular shapes whose sizes are different from each other.

An example where the antenna layer 252 has a quadrangular shape is illustrated in FIG. 3. However, other shapes of the antenna layer 252 are considered to be well within the scope of the present disclosure.

Figure 4:
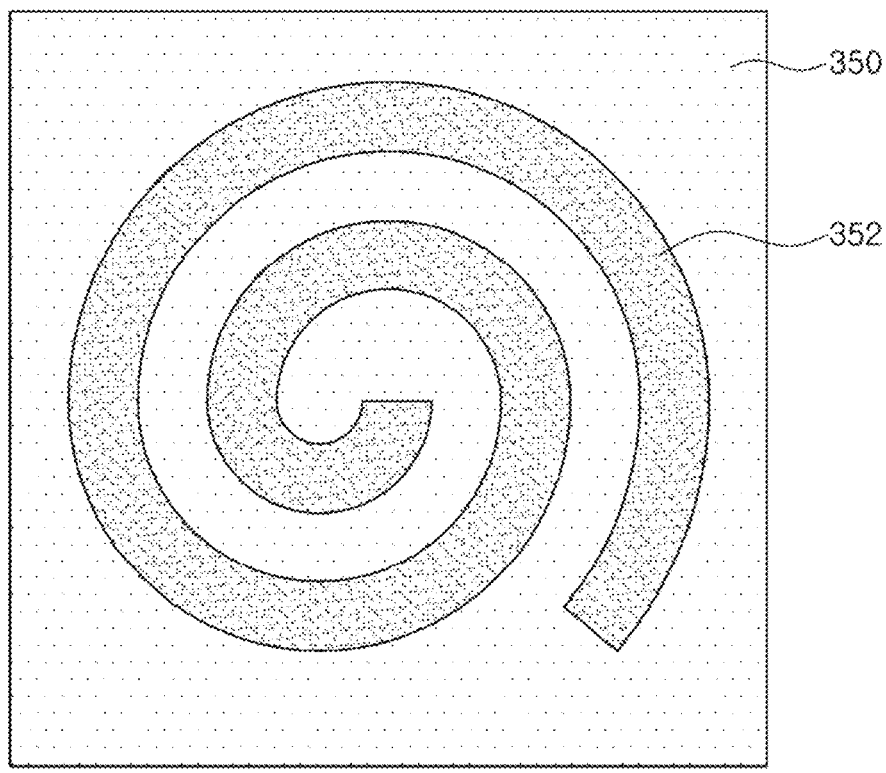
FIG. 4 is a diagram illustrating a second modified example of an antenna layer.

FIG. 4 is a diagram illustrating a second modified example of an antenna layer.

Referring to FIG. 4, a second wiring portion 350 includes an antenna layer 352. The antenna layer 352 may be provided as a plurality of layers formed in the second wiring portion 350.

In addition, the antenna layer 352 has a circular or elliptical spiral shape.

An example where the antenna layer 352 has an elliptical spiral shape is illustrated in FIG. 4. However, other shapes of the antenna layer 352 are considered to be well within the scope of the present disclosure.

Figure 5:
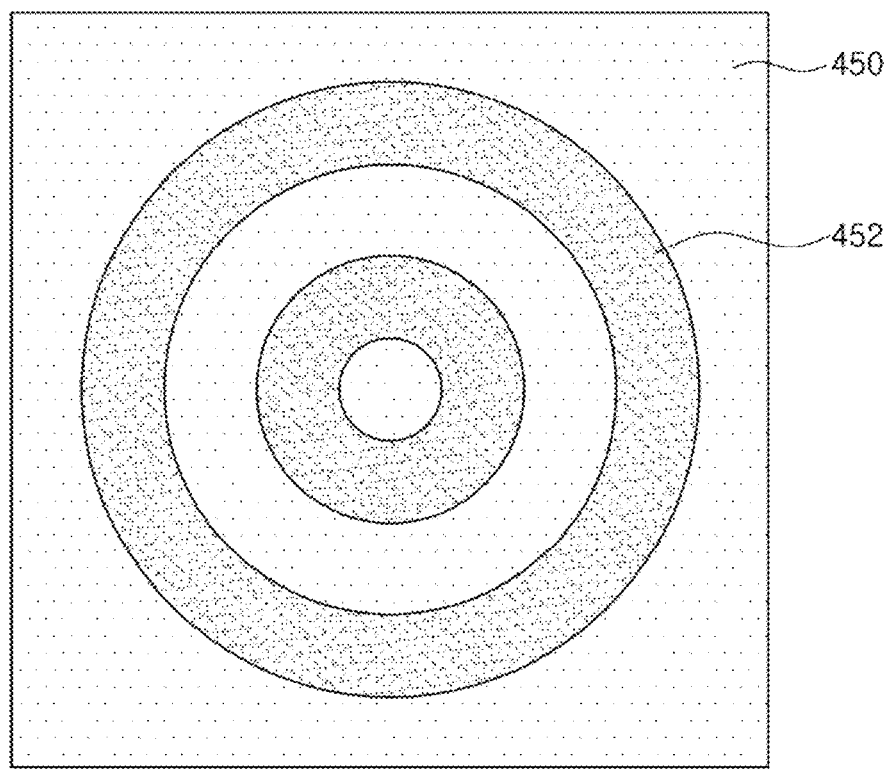
FIG. 5 is a diagram illustrating a third modified example of an antenna layer.

FIG. 5 is a diagram illustrating a third modified example of an antenna layer.

Referring to FIG. 5, a second wiring portion 450 includes an antenna layer 452. The antenna layer 452 may be provided as a plurality of layers formed in the second wiring portion 450.

In addition, the antenna layer 452 has a circular or elliptical shape when viewed from above. In an example, the antenna layer 452 having a plurality of circular or elliptical shapes whose sizes are different from each other may be formed.

An example where the antenna layer 452 has an elliptical shape is illustrated in FIG. 5. However, other shapes of the antenna layer 452 are considered to be well within the scope of the present disclosure.

Figure 6:
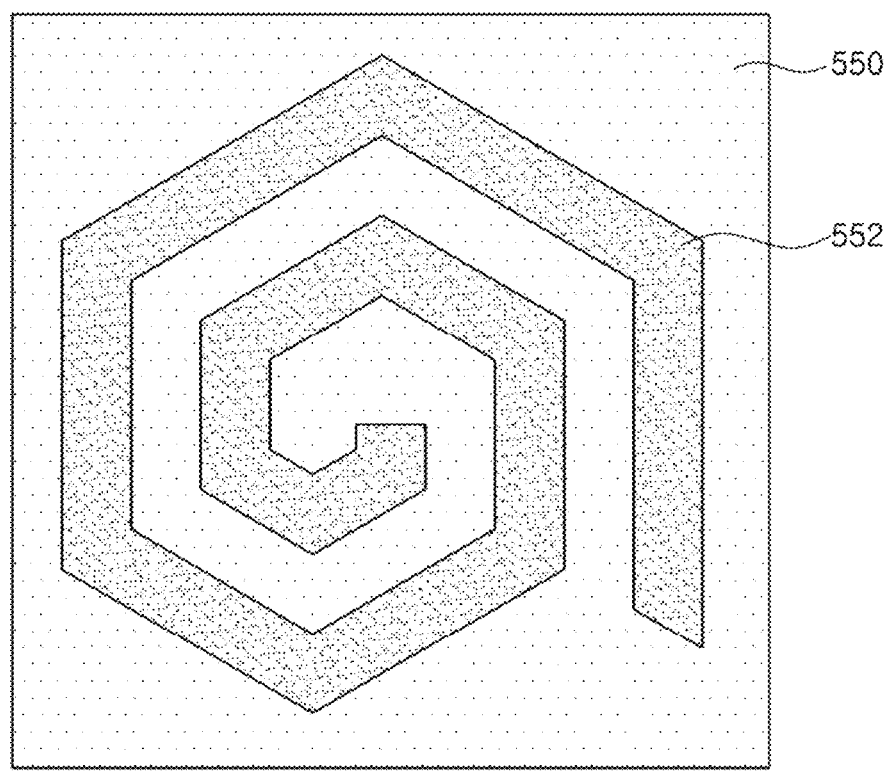
FIG. 6 is a diagram illustrating a fourth modified example of an antenna layer.

FIG. 6 is a diagram illustrating a fourth modified example of an antenna layer.

Referring to FIG. 6, a second wiring portion 550 includes an antenna layer 552. The antenna layer 552 is provided as a plurality of layers formed in the second wiring portion 550.

In addition, the antenna layer 552 has a hexagonal spiral shape.

As example where the antenna layer 552 has a hexagonal spiral shape is illustrated in FIG. 6. However, other shapes of the antenna layer 552 are considered to be well within the scope of the present disclosure.

Figure 7:
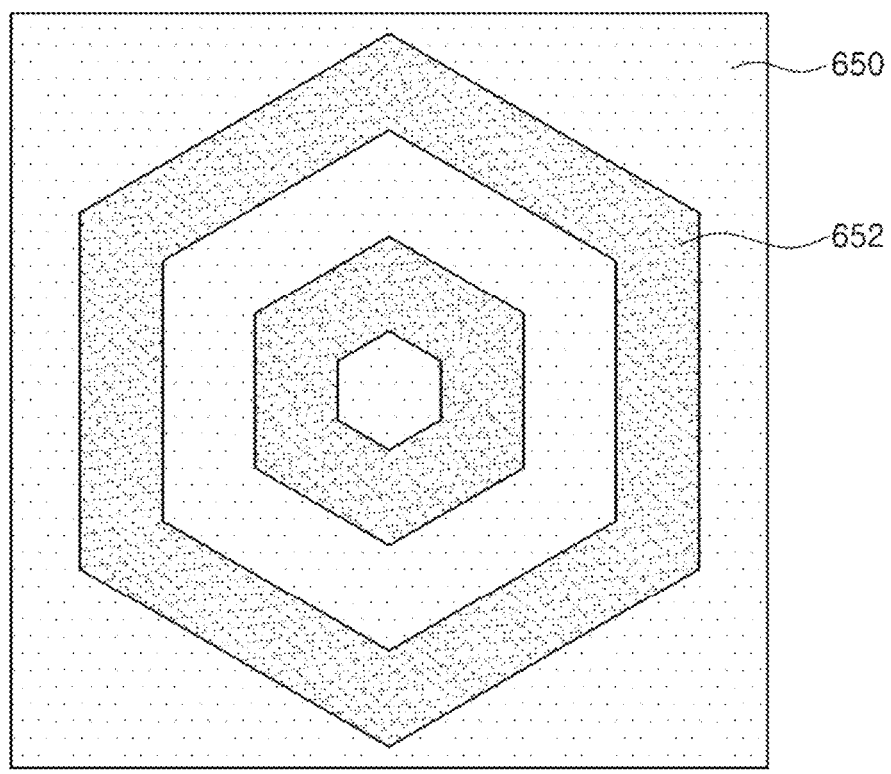
FIG. 7 is a diagram illustrating a fifth modified example of an antenna layer.

FIG. 7 is a diagram illustrating a fifth modified example of an antenna layer.

Referring to FIG. 7, a second wiring portion 650 includes an antenna layer 652. The antenna layer 652 is provided as a plurality of layers formed in the second wiring portion 650.

In addition, the antenna layer 652 has a hexagonal shape when viewed from above. In an example, the antenna layer 652 may be formed to have a plurality of hexagonal shapes whose sizes are different from each other.

An example where the antenna layer 652 has a hexagonal shape is illustrated in FIG. 7. However, other shapes of the antenna layer 652 are considered to be well within the scope of the present disclosure. In an example, the antenna layer 652 has any one or any combination of a spiral shape, a circular shape, an elliptical shape, a quadrangular spiral shape, a quadrangular shape, an elliptical spiral shape, a hexagonal shape, a hexagonal spiral shape, and a polygonal shape.

Figure 8:
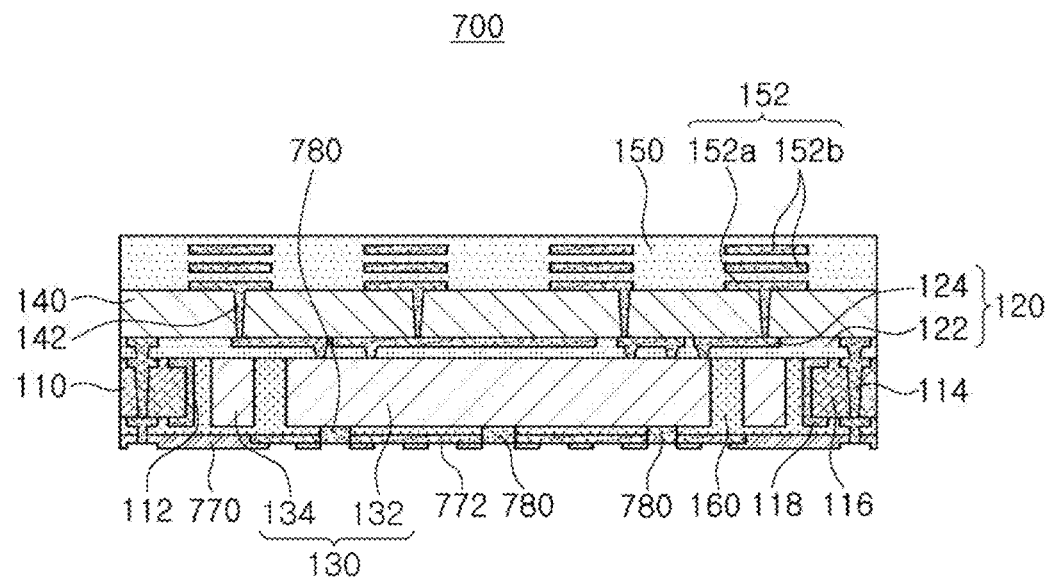
FIG. 8 is a diagram illustrating a substrate having an electronic component embedded therein according to a second example.

FIG. 8 is a diagram illustrating a substrate having an electronic component embedded therein according to a second example.

Referring to FIG. 8, a substrate 700 having an electronic component embedded therein according to a second example includes a frame 110, a first wiring portion 120, an electronic component 130, a first layer 140, a second wiring portion 150, an insulating layer 770, and a via member 780.

The frame 110, the first wiring portion 120, the electronic component 130, the first layer 140, and the second wiring portion 150 included in the substrate 700 are similar to the configuration included in the substrate 100 according to a first example described previously. In addition to the description of FIG. 8 below, the descriptions of FIGS. 1-7 are also applicable to FIG. 8, and are incorporated herein by reference. Thus, the above description may not be repeated here.

In an example, the insulating layer 770 is formed in the other surface of the frame 110 and the electronic component 130. In an example, an electrode pad 772 is disposed in the insulating layer 770 such that the electrode pad 772 is externally exposed. In other words, an opening is formed in the insulating layer 770 to expose the electrode pad 772 externally.

The via member 780 is formed to connect the electronic component 130 to the electrode pad 772, and serves to release heat generated by the electronic component 130 externally through the electrode pad 772. In an example, the via member 780 is provided as a plurality of via members.

Figure 9:
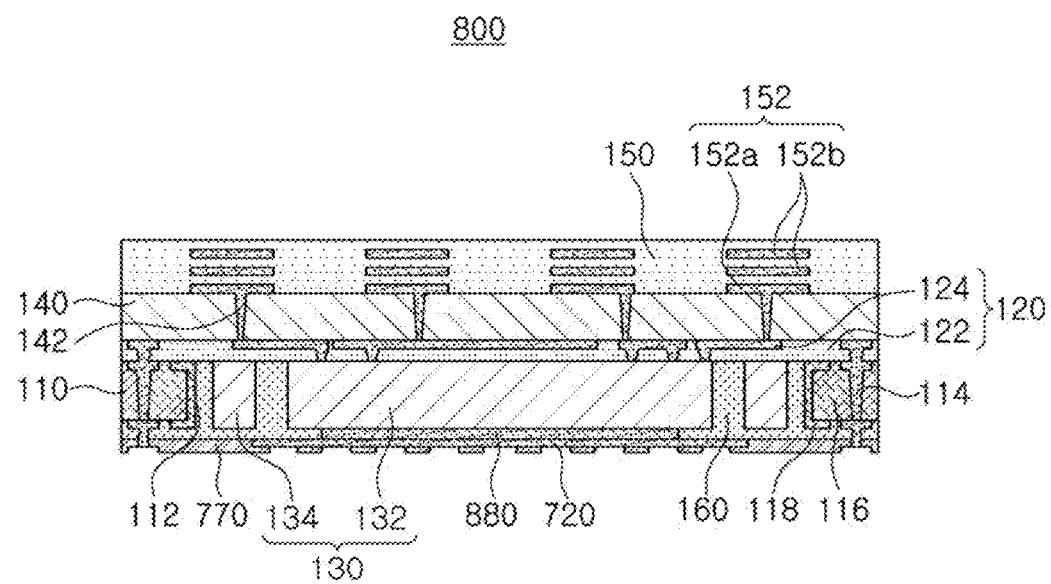
FIG. 9 is a diagram illustrating a substrate having an electronic component embedded therein according to a third example.

FIG. 9 is a diagram illustrating a substrate having an electronic component embedded therein according to a third example.

Referring to FIG. 9, a substrate 800 having an electronic component embedded therein according to a third example includes a frame 110, a first wiring portion 120, an electronic component 130, a first layer 140, a second wiring portion 150, an insulating layer 770, and a via member 880

The frame 110, the first wiring portion 120, the electronic component 130, the first layer 140, and the second wiring portion 150 included in the substrate 800 according to a third example are similar to the configuration included in the substrate 100 according to a first example described previously. In addition to the description of FIG. 9 below, the descriptions of FIGS. 1-8 are also applicable to FIG. 8, and are incorporated herein by reference. Thus, the above description may not be repeated here.

In an example, the insulating layer 770 is formed in the other surface of the frame 110 and the electronic component 130. In an example, an electrode pad 720 is disposed in the insulating layer 770 such that the electrode pad 720 is externally exposed. In other words, an opening is formed in the insulating layer 770 to expose the electrode pad 720 externally.

The via member 880 is formed to connect the electronic component 130 to the electrode pad 720, and serves to release heat generated by the electronic component 130 externally through the electrode pad 720. In an example, the via member 880 has a bar shape.

As set forth above, according to examples, the occurrence of defects may be prevented and unnecessary loss may be suppressed, so a desired level of performance may be improved.

Thinning may also be implemented.

Some of the examples described above, disclose a substrate having an electronic component embedded therein, which are capable of preventing the occurrence of defects and improving performance.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A substrate having an electronic component, comprising:
    a frame having a through hole, wherein the electronic component is disposed in the through hole;
    a first wiring portion, formed on a surface of the frame and the electronic component, comprising a first insulating layer and a wiring layer;
    a first layer, formed on an outer surface of the first wiring portion, comprising a via extending from a top surface of the first layer to a bottom surface of the first layer; and
    a second wiring portion, formed on the first layer, comprising an antenna layer,
    wherein the via directly connects a pattern layer of the first wiring portion in contact with the bottom surface of the first layer to the antenna layer in contact with the top surface of the first layer, and;
    wherein the first layer has a thickness greater than that of the first wiring portion formed of a single layer.

2. The substrate of claim 1, wherein the antenna layer comprises a plurality of layers.

3. The substrate of claim 1, wherein the electronic component comprises an RF IC chip disposed in a central portion of the through hole, and a passive device is disposed around the RF IC chip.

4. The substrate of claim 1, wherein the through hole is filled with a molding layer to fix the electronic component.

5. The substrate of claim 4, wherein a connection electrode is provided in the molding layer, and configured to form an external electrical connection.

6. The substrate of claim 1, wherein an inner surface of the frame is provided with a conductor layer.

7. The substrate of claim 1, wherein a via is formed in the frame to provide external electrical connection.

8. The substrate of claim 1, wherein the first layer is formed of a film of a photo imageable dielectric (PID) material.

9. The substrate of claim 1, wherein the antenna layer comprises a main antenna layer connected to the electronic component, and a dummy antenna layer disposed above the main antenna layer.

10. The substrate of claim 1, wherein a second insulating layer is formed on another surface of the frame and the electronic component.

11. The substrate of claim 10, wherein an electrode pad extends externally out of the second insulating layer.

12. The substrate of claim 11, wherein the electrode pad is connected to the electronic component through a via member.

13. The substrate of claim 1, wherein the antenna layer has any one or any combination of a spiral shape, a circular shape, an elliptical shape, a quadrangular spiral shape, a quadrangular shape, an elliptical spiral shape, a hexagonal shape, a hexagonal spiral shape, and a polygonal shape.

14. The substrate of claim 2, wherein a size of at least one layer of the plurality of layers is different from sizes of remaining layers of the plurality of layers.

15. A substrate having an electronic component, comprising:
a frame having a through hole, wherein the electronic component is disposed in the through hole;
a first wiring portion, formed on a surface of the frame and the electronic component, comprising a first insulating layer and a first wiring layer;
a first layer, formed on an outer surface of the first wiring portion, comprising a via extending from a top surface of the first layer to a bottom surface of the first layer;
a second wiring portion, formed on the first layer, comprising an antenna layer, wherein a second insulating layer is formed on another surface of the frame and the electronic component; and
a via member connecting an electrode pad formed in the second insulating layer to the electronic component,
wherein the via directly connects a pattern layer of the first wiring portion in contact with the bottom surface of the first layer to the antenna layer in contact with the top surface of the first layer, and
wherein the first layer has a thickness greater than that of the first wiring portion formed of a single layer.

16. The substrate of claim 15, wherein the antenna layer comprises a main antenna layer connected to the electronic component, and a dummy antenna layer disposed above the main antenna layer.

17. The substrate of claim 1, wherein the first layer is formed of a first material different from a second material of the second wiring portion.

18. A substrate having an electronic component, comprising:
a frame having a through hole, wherein the electronic component is disposed in the through hole;
a first wiring portion, formed on a surface of the frame and the electronic component, comprising a first insulating layer and a first wiring layer;
a first layer, formed on a surface of the first wiring portion, comprising a via extending from a top surface of the first layer to a bottom surface of the first layer;
a second wiring portion, formed on the first layer, comprising an antenna layer, wherein a second insulating layer is formed on another surface of the frame and the electronic component; and
a via member connecting an electrode pad formed in the second insulating layer to the electronic component,
wherein the via directly connects a pattern layer of the first wiring portion in contact with the bottom surface of the first layer to the antenna layer in contact with the top surface of the first layer,
wherein the first layer has a thickness greater than that of the first wiring portion formed of a single layer,
the first layer excludes portions of the first wiring portion.

19. The substrate of claim 1, wherein the first layer is formed of a film of a photo imageable dielectric (PID) material, and
the first layer is formed of a first material different from a second material of the second wiring portion.

20. The substrate of claim 1, wherein the top surface and the bottom surface of the first layer are flat.

* * * * *